US012648203B2

(12) United States Patent
Akasaka

(10) Patent No.: US 12,648,203 B2
(45) Date of Patent: Jun. 2, 2026

(54) ELECTRODE OF SEMICONDUCTOR DEVICE AND METHOD OF MANUFACTURING SAME

(71) Applicant: Tokyo Electron Limited, Tokyo (JP)

(72) Inventor: Yasushi Akasaka, Nirasaki City (JP)

(73) Assignee: Tokyo Electron Limited, Tokyo (JP)

( * ) Notice: Subject to any disclaimer, the term of this patent is extended or adjusted under 35 U.S.C. 154(b) by 503 days.

(21) Appl. No.: 18/041,162

(22) PCT Filed: Aug. 2, 2021

(86) PCT No.: PCT/JP2021/028646
§ 371 (c)(1),
(2) Date: Feb. 9, 2023

(87) PCT Pub. No.: WO2022/034826
PCT Pub. Date: Feb. 17, 2022

(65) Prior Publication Data
US 2023/0268183 A1 Aug. 24, 2023

(30) Foreign Application Priority Data

Aug. 13, 2020 (JP) ................................. 2020-136671

(51) Int. Cl.
*H10D 64/01* (2025.01)
*H10D 64/62* (2025.01)
(Continued)

(52) U.S. Cl.
CPC ......... *H10D 64/0112* (2026.01); *H10D 64/01* (2025.01); *H10D 64/62* (2025.01);
(Continued)

(58) Field of Classification Search
CPC ............. H01L 21/28518; H01L 84/017; H01L 64/251; H10D 64/0186; H10D 64/0112; H10D 64/62
See application file for complete search history.

(56) References Cited

U.S. PATENT DOCUMENTS

| | | |
|---|---|---|
| 5,476,814 A | 12/1995 | Ohshima et al. |
| 5,721,175 A | 2/1998 | Kunishima et al. |

(Continued)

FOREIGN PATENT DOCUMENTS

| | | | | |
|---|---|---|---|---|
| EP | 0736896 A2 | * | 10/1996 | ........... H01L 23/485 |
| EP | 0 634 788 | * | 2/2002 | ........... H01L 21/285 |

(Continued)

*Primary Examiner* — Mary A Wilczewski
(74) *Attorney, Agent, or Firm* — Armstrong Teasdale LLP

(57) ABSTRACT

A method of manufacturing an electrode of a semiconductor device includes: preparing a semiconductor substrate including an impurity-doped region; forming a first metal layer on the impurity-doped region; forming a second metal layer on the first metal layer; and heating the semiconductor substrate including the first metal layer and the second metal layer, wherein the impurity-doped region contains silicon, wherein the first metal layer contains tantalum, wherein the second metal layer contains titanium, and wherein, by the heating, a first silicide layer containing titanium, tantalum, and silicon is formed on the impurity-doped region, and a second silicide layer containing titanium and silicon is formed on the first silicide layer.

4 Claims, 7 Drawing Sheets

(51) Int. Cl.
    *H10D 84/01*       (2026.01)
    *H10D 84/03*       (2025.01)
    *H10D 84/85*       (2025.01)

(52) U.S. Cl.
    CPC ......... *H10D 84/017* (2025.01); *H10D 84/038*
              (2025.01); *H10D 84/85* (2025.01)

(56)            References Cited

U.S. PATENT DOCUMENTS

| | | | | |
|---|---|---|---|---|
| 5,736,440 | A * | 4/1998 | Manning | H10D 84/856 |
| | | | | 438/231 |
| 6,316,357 | B1 * | 11/2001 | Lin | H01L 21/268 |
| | | | | 438/662 |
| 6,486,513 | B1 * | 11/2002 | Matsumoto | H10D 86/01 |
| | | | | 257/349 |
| 7,518,921 | B2 | 4/2009 | Maejima et al. | |
| 9,583,397 | B1 * | 2/2017 | Deniz | H10D 84/0186 |
| 2007/0141836 | A1 * | 6/2007 | Yamauchi | H01L 21/28537 |
| | | | | 438/651 |

| | | | | | |
|---|---|---|---|---|---|
| 2023/0246081 | A1 * | 8/2023 | Lin | | H10D 64/01 |
| | | | | | 257/339 |
| 2023/0268183 | A1 * | 8/2023 | Akasaka | | H10D 84/85 |
| | | | | | 257/757 |

FOREIGN PATENT DOCUMENTS

| | | | | | |
|---|---|---|---|---|---|
| EP | | 3001452 | A1 * | 3/2016 | ....... H01L 21/26513 |
| JP | | S61-206243 | A | 9/1986 | |
| JP | | 103-209773 | A | 9/1991 | |
| JP | | H05-182982 | A | 7/1993 | |
| JP | | H05-315286 | A | 11/1993 | |
| JP | | H09-171969 | A | 6/1997 | |
| JP | | H09-321280 | A | 12/1997 | |
| JP | | 2000-349169 | A | 12/2000 | |
| JP | | 2006-186326 | A | 7/2006 | |
| JP | | 2006-310842 | A | 11/2006 | |
| JP | | 2007-527111 | A | 9/2007 | |
| KR | 10-2002-0012923 | | A | 2/2002 | |
| KR | | 10-0618895 | B1 | 9/2006 | |
| WO | | WO-9620499 | A1 * | 7/1996 | ......... H10D 84/0184 |
| WO | | WO-02067305 | A2 * | 8/2002 | ......... H10D 30/0227 |

\* cited by examiner

ELECTRODE OF SEMICONDUCTOR DEVICE AND METHOD OF MANUFACTURING SAME

CROSS-REFERENCE TO RELATED APPLICATIONS

The present application is a U.S. National Stage Entry of International Patent Application No. PCT/JP2021/028646, filed Aug. 2, 2021, which claims the benefit of priority to Japanese Patent Application No. 2020-136671, filed Aug. 13, 2020, each of which is hereby incorporated herein by reference in its entirety.

TECHNICAL FIELD

Exemplary embodiments of the present disclosure relate to an electrode of a semiconductor device and a method of manufacturing the same.

BACKGROUND

Silicide, which is a combination of metal and silicon, is used as material of an electrode of a semiconductor device. Patent Documents 1 to 9 disclose the silicide. Further, Patent Document 10 discloses a method of adding boron (B) into a titanium silicide layer.

PRIOR ART DOCUMENTS

Patent Documents

Patent Document 1: Japanese Patent Laid-Open Publication No. 2007-527111
Patent Document 2: Japanese Patent Laid-Open Publication No. 2006-186326
Patent Document 3: Japanese Patent Laid-Open Publication No. 2000-349169
Patent Document 4: Japanese Patent Laid-Open Publication No. H09-321280
Patent Document 5: Japanese Patent Laid-Open Publication No. H09-171969
Patent Document 6: Japanese Patent Laid-Open Publication No. H05-315286
Patent Document 7: Japanese Patent Laid-Open Publication No. H03-209773
Patent Document 8: Japanese Patent Laid-Open Publication No. H05-182982
Patent Document 9: Specification of U.S. Pat. No. 7,518, 921
Patent Document 10: Specification of U.S. Pat. No. 5,721, 175 Specification The present disclosure provides a technique of suppressing an increase in contact resistance in an electrode of a semiconductor device.

SUMMARY

According to an exemplary embodiment of the present disclosure, there is provided a method of manufacturing an electrode of a semiconductor device. The method of manufacturing the electrode of the semiconductor device includes providing a semiconductor substrate including an impurity-doped region. The method further includes forming a first metal layer on the impurity-doped region. The method further includes forming a second metal layer on the first metal layer. The method further includes heating the semiconductor substrate including the first metal layer and the second metal layer. The impurity-doped region contains silicon. The first metal layer contains tantalum. The second metal layer contains titanium. By the heating, a first silicide layer containing titanium, tantalum, and silicon is formed on the impurity-doped region, and a second silicide layer containing titanium and silicon is formed on the first silicide layer According to an exemplary embodiment of the present disclosure, it is possible to suppress an increase in contact resistance in an electrode of a semiconductor device.

BRIEF DESCRIPTION OF DRAWINGS

FIGS. 2A, 2B, 2C, and 2D are diagrams illustrating a method of manufacturing an electrode of a semiconductor device according to a second embodiment of the present disclosure.

FIGS. 3A, 3B, and 3C are diagrams illustrating a method of manufacturing an electrode of a semiconductor device according to a comparative example.

FIGS. 5A, 5B, 5C, 5D, 5E, 5F and 5G are diagrams illustrating a first manufacturing method of a semiconductor device including an electrode according to an exemplary embodiment of the present disclosure.

FIGS. 7A and 7B are diagrams for illustrating a third manufacturing method of a semiconductor device including an electrode according to an exemplary embodiment of the present disclosure.

DETAILED DESCRIPTION

Figures 1A, 1B, 1C, 1D:
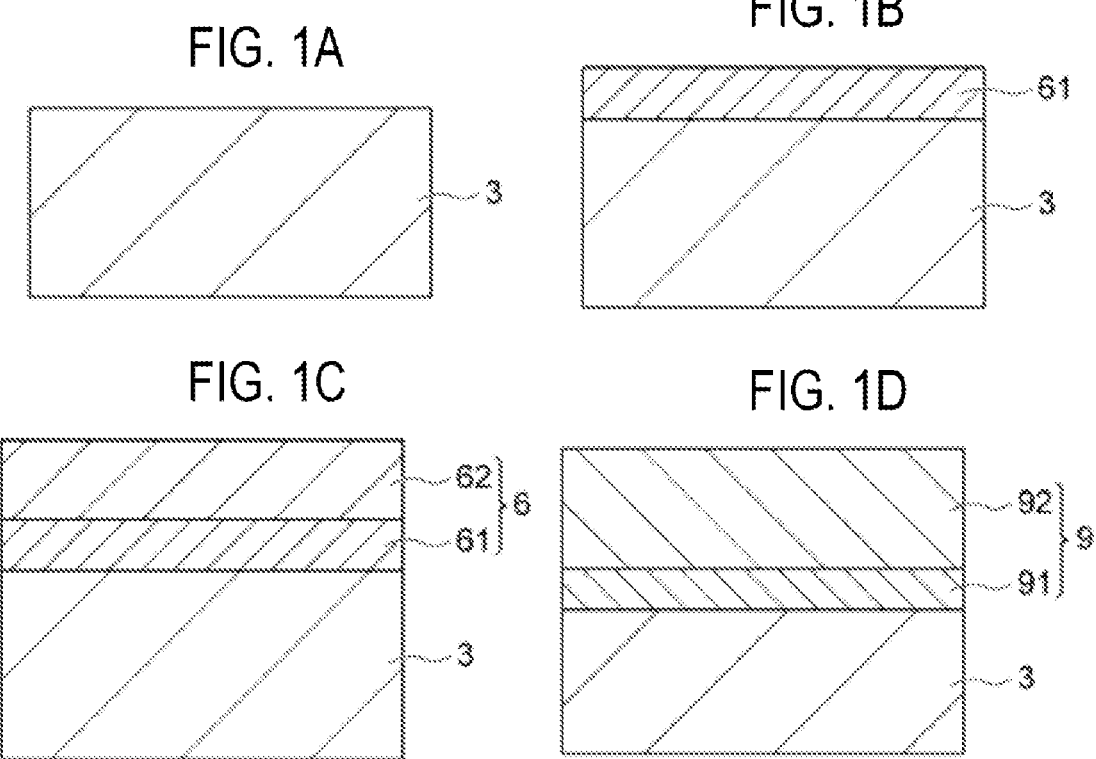
FIGS. 1A, 1B, 1C, and 1D are diagrams illustrating a method of manufacturing an electrode of a semiconductor device according to a first embodiment of the present disclosure.

Hereinafter, various exemplary embodiments of the present disclosure will be described.

In an exemplary embodiment of the present disclosure, a method of manufacturing an electrode of a semiconductor device is provided. The method includes providing a semiconductor substrate including an impurity-doped region. The method further includes forming a first metal layer on the impurity-doped region. The method further includes forming a second metal layer on the first metal layer. The method further includes heating the semiconductor substrate including the first metal layer and the second metal layer. The impurity-doped region contains silicon (Si). The first metal layer contains tantalum (Ta). The second metal layer contains titanium (Ti). By the heating, a first silicide layer containing titanium, tantalum, and silicon is formed on the impurity-doped region, and a second silicide layer containing titanium and silicon is formed on the first silicide layer.

When bonding between titanium and an impurity in the impurity-doped region occurs, the impurity concentration in the impurity-doped region is reduced. Further, when the bonding between titanium and the impurity in the impurity-doped region occurs, a layer with high specific resistance may be formed. According to the method of manufacturing the electrode of the semiconductor device of the above-described embodiment, tantalum contained in the first metal layer and in the first silicide layer suppresses diffusion of the impurity contained in the impurity-doped region and the bonding between the impurity and titanium contained in the second metal layer. Accordingly, according to this manufacturing method, the contact resistance between the impurity-doped region and the first silicide layer may be reduced.

In an exemplary embodiment of the present disclosure, a method of manufacturing an electrode of a semiconductor device is provided. The method includes providing a semiconductor substrate including an impurity-doped region and an oxide film formed on the impurity-doped region. The method further includes forming a first metal layer on the impurity-doped region with the oxide film interposed therebetween. The manufacturing method further includes forming a second metal layer on the first metal layer. The method further includes heating the semiconductor substrate including the first metal layer and the second metal layer. The impurity-doped region contains silicon (Si). The oxide film contains silicon dioxide ($SiO_2$). The first metal layer contains a high melting point metal including at least one selected from the group of tantalum (Ta), tungsten (W), and molybdenum (Mo). The second metal layer contains titanium (Ti). By the heating, a first silicide layer containing titanium, the high melting point metal, and silicon is formed on the semiconductor substrate, and a second silicide layer containing titanium and silicon is formed on the first silicide layer. Further, by the heating, a titanium oxide layer is formed on the second silicide layer.

Similarly to the above description, the high melting point metal contained in the first metal layer and in the first silicide layer suppresses diffusion of the impurity contained in the impurity-doped region and the bonding between the impurity and titanium contained in the second metal layer. Thus, the contact resistance between the impurity-doped region and the first silicide layer may be reduced.

Further, in the heating, oxygen contained in the oxide film bonds with titanium contained in the second metal layer to form a titanium oxide layer. As a result, the oxide film that may interfere with a uniform silicidation reaction between the impurity-doped region and the first metal layer is removed. Therefore, non-uniformity of the silicidation reaction between the impurity-doped region and the first metal layer is reduced.

An electrode of a semiconductor device according to an exemplary embodiment of the present disclosure includes a first silicide layer and a second silicide layer. The first silicide layer is located on an impurity-doped region and contains titanium, tantalum, and silicon. The second silicide layer is located on the first silicide layer and contains titanium and silicon.

An electrode of a semiconductor device according to an exemplary embodiment of the present disclosure includes a first silicide layer, a second silicide layer, and a titanium oxide layer. The first silicide layer is located on an impurity-doped region and contains titanium, a high melting point metal, and silicon. The second silicide layer is located on the first silicide layer and contains titanium and silicon. The titanium oxide layer is located on the second silicide layer. The high melting point metal includes at least one selected from the group of tantalum, tungsten, and molybdenum.

In an exemplary embodiment of the present disclosure, an impurity in the impurity-doped region is boron (B).

Hereinafter, various exemplary embodiments will be described in detail with reference to the drawings. In addition, the same reference numerals will be given to the same or corresponding components in each drawing, and redundant descriptions will be omitted.

First Embodiment

Hereinafter, a method of manufacturing an electrode of a semiconductor device according to a first embodiment of the present disclosure will be described with reference to FIGS. 1A, 1B, 1C, and 1D. FIGS. 1A, 1B, 1C, and 1D are diagrams illustrating the method of manufacturing the electrode of the semiconductor device according to the first embodiment. This method of manufacturing the electrode includes (a) substrate preparation step, (b) first metal layer formation step, (c) second metal layer formation step, and (d) heating step. The (a) substrate preparation step, (b) first metal layer formation step, (c) second metal layer formation step, and (d) heating step are performed in this order. Hereinafter, these steps will be described.

(a) Substrate Preparation Step

In the substrate preparation step, a semiconductor substrate is prepared. As illustrated in FIG. 1A, the semiconductor substrate includes an impurity-doped region 3 (diffusion layer). The impurity-doped region 3 is located on the side of a surface of the semiconductor substrate. The semiconductor substrate and the impurity-doped region 3 contain silicon. An impurity in the impurity-doped region 3 is boron. The impurity-doped region 3 is formed by implanting impurity ions into the semiconductor substrate. After this ion implantation, the impurity in the impurity-doped region 3 is electrically activated by heating (annealing) the semiconductor substrate. For example, the annealing temperature is 800 degrees C. and the annealing time is several tens of minutes. As another example, the annealing temperature is 1000 degrees C. or higher and the annealing time is very short (e.g., less than 1 second).

(b) First Metal Layer Formation Step

In the first metal layer formation step, as illustrated in FIG. 1B, a first metal layer 61 is formed on the impurity-doped region 3. A method of forming the first metal layer 61 is a sputtering method or the like. The first metal layer 61 is a tantalum layer containing tantalum. A thickness of the first metal layer 61 is, for example, 2 nm to 100 nm.

(c) Second Metal Layer Formation Step

In the second metal layer formation step, as illustrated in FIG. 1C, a second metal layer 62 is formed on the first metal layer 61. A method of forming the second metal layer 62 is a sputtering method or the like. The second metal layer 62 is a titanium layer containing titanium. The thickness of the second metal layer 62 is, for example, 2 nm to 100 nm.

(d) Heating Step

In the heating step (silicidation reaction annealing step), the semiconductor substrate including the first metal layer 61 and the second metal layer 62 is heated (annealed). For example, in a first annealing condition, the annealing temperature is 650 degrees C. and the annealing time is 30 seconds. As another example, in a second annealing condition, the annealing temperature is 900 degrees C. and the annealing time is 30 seconds. The semiconductor substrate may be annealed under the second annealing condition after being annealed under the first annealing condition.

This annealing causes a silicidation reaction among materials constituting the impurity-doped region 3, the first metal layer 61, and the second metal layer 62. Silicon contained in the impurity-doped region 3 is consumed along with the silicidation reaction. As a result of the silicidation reaction by this annealing, a silicide layer 9 is formed, as illustrated in FIG. 1D. The silicide layer 9 includes a first silicide layer 91 and a second silicide layer 92. The first silicide layer 91 is formed on the impurity-doped region 3. The second silicide layer 92 is formed on the first silicide layer 91. By this annealing, an electrode of a semiconductor device including the first silicide layer 91 and the second silicide layer 92 is provided.

The first silicide layer 91 is formed of a compound (Ti—Ta—Si) containing titanium, tantalum, and silicon. The second silicide layer 92 is formed of a compound ($TiSi_X$) containing titanium and silicon. Here, "X" in "$TiSi_X$" is 2, for example.

In the present embodiment, an impurity concentration at an interface between the first silicide layer 91 and the impurity-doped region 3 after the silicidation reaction is $1 \times 10^{20}$ $cm^{-3}$ or more. The impurity at this interface is assumed to be activated. Generally, good electrical conduction is obtained when the concentration of the activated impurity is $1 \times 10^{20}$ $cm^{-3}$ or more. The impurity concentration of the impurity-doped region 3 after activation in the "(a) substrate preparation step" is set higher than $1 \times 10^{20}$ $cm^{-3}$ to obtain good electrical conduction after silicide formation. For example, the impurity concentration before the silicidation reaction is set to $5 \times 10^{20}$ $cm_{-3}$ or more at a position corresponding to the interface between the first silicide layer 91 and the impurity-doped region 3 after the silicidation reaction. In addition, in the above-described "(a) substrate preparation step," a peak position of the impurity concentration in the impurity-doped region 3 is set, for example, to a position of 100 nm or less from the surface of the substrate.

<First Action Effect>

In the above-described "(d) heating step," when bonding between titanium and the impurity in the impurity-doped region 3 occurs, the impurity concentration in the impurity-doped region 3 is reduced. Further, when the bonding between titanium and the impurity in the impurity doped region 3 occurs, a titanium boride layer ($TiB_2$ layer) with high specific resistance may be formed. Tantalum contained in the first metal layer 61 and in the first silicide layer 91 prevents diffusion of the impurity contained in the impurity-doped region 3 and the bonding between the impurity and titanium contained in the second metal layer 62. Accordingly, with this manufacturing method, contact resistance between the impurity-doped region 3 and the first silicide layer 91 may be reduced.

<Second Action Effect>

In the manufacturing method of the semiconductor device, the semiconductor substrate may be heated to a high temperature after the silicide layer 9 is formed. For example, the semiconductor substrate is heated at a temperature of 1000 degrees C. for several seconds after the formation of the silicide layer 9. As another example, the semiconductor substrate is heated at a temperature of about 850 degrees C. for about one hour after the formation of the silicide layer 9. As still another example, a heat treatment of 800 degrees C. or higher (about 850 degrees C.) is performed on the semiconductor substrate, for example, in a step of forming a three-dimensional NAND silicon channel. Such heat treatment is also performed when manufacturing a three-dimensional LSI.

The first silicide layer 91 contains tantalum and prevents diffusion and bonding of boron and titanium, similarly to the first metal layer 61. Accordingly, with the first silicide layer 91, an increase in contact resistance is prevented. Further, with the first silicide layer 91, a highly heat-resistant contact is obtained since it is resistant to aggregation due to heat.

Second Embodiment

Hereinafter, a method of manufacturing an electrode of a semiconductor device according to a second embodiment of the present disclosure will be described with reference to FIGS. 2A, 2B, 2C, and 2D. FIGS. 2A, 2B, 2C, and 2D are diagrams illustrating a method of manufacturing an electrode of a semiconductor device according to the second embodiment. This method of manufacturing the electrode includes (a) substrate preparation step, (b) first metal layer formation step, (c) second metal layer formation step, and (d) heating step. The (a) substrate preparation step, (b) first metal layer formation step, (c) second metal layer formation step, and (d) heating step are performed in this order. Hereinafter, these steps will be described.

(a) Substrate Preparation Step

Figures 2A, 2B, 2C, 2D:
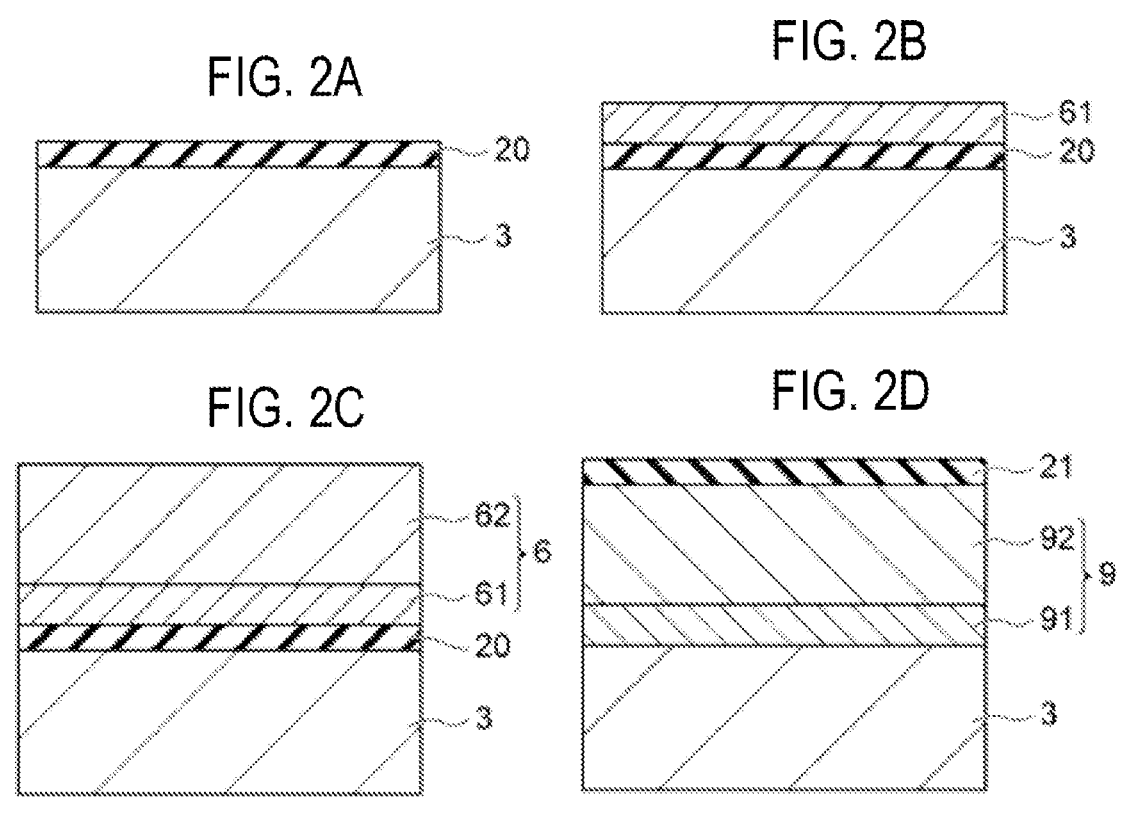

In the substrate preparation step, a semiconductor substrate is prepared. As illustrated in FIG. 2A, the semiconductor substrate includes the impurity-doped region 3 and an oxide film 20 formed on the impurity-doped region 3. The impurity-doped region 3 is located on the side of a surface of the semiconductor substrate. The semiconductor substrate and the impurity-doped region 3 contain silicon.

The oxide film 20 contains silicon dioxide. The thickness of the oxide film 20 is about 1 nm to 2 nm. The oxide film 20 is a native oxide film. The native oxide film may be formed by exposing an exposed surface of the impurity-doped region 3 to air or an oxygen atmosphere. The oxide film 20 may also be formed by cleaning or the like. The oxide film 20 in this case is a chemical oxide. The "(a) substrate preparation step" of the second embodiment is the same as the "(a) substrate preparation step" of the first embodiment except that the oxide film 20 is formed on the surface of the impurity-doped region 3, and various conditions thereof are also the same as the corresponding conditions of the "(a) substrate preparation step" of the first embodiment.

(b) First Metal Layer Formation Step

In the first metal layer formation step, as illustrated in FIG. 2B, the first metal layer 61 is formed on the impurity-doped region 3 with the oxide film 20 interposed therebetween. A method of forming the first metal layer 61 is a sputtering method or the like. The first metal layer 61 is a high melting point metal layer containing a high melting point metal. The high melting point metal includes at least one selected from the group of tantalum, tungsten, and molybdenum. The thickness of the first metal layer 61 in the second embodiment may be set to be the same as the thickness of the first metal layer 61 in the first embodiment.

(c) Second Metal Layer Formation Step

In the second metal layer formation step, as illustrated in FIG. 2C, the second metal layer 62 is formed on the first metal layer 61. The "(c) second metal layer formation step" of the second embodiment is the same step as the "(c) second metal layer formation step" of the first embodiment, and various conditions thereof are also the same as the corresponding conditions of the "(c) second metal layer formation step" of the first embodiment.

(d) Heating Step

In the heating step (silicidation reaction annealing step), the semiconductor substrate including the first metal layer 61 and the second metal layer 62 is heated (annealed). The "(d) heating step" of the second embodiment is the same as the "(d) heating step" of the first embodiment, and various conditions thereof are also the same as the corresponding conditions of the "(d) heating step" of the first embodiment.

As a result of the silicidation reaction by this annealing, the silicide layer 9 is formed, as illustrated in FIG. 2D. The silicide layer 9 includes the first silicide layer 91 and the second silicide layer 92. By this annealing, an electrode of a semiconductor device including the first silicide layer 91 and the second silicide layer 92 is provided. The first silicide layer 91 is formed on the impurity-doped region 3. The second silicide layer 92 is formed on the first silicide layer 91. Further, by this annealing, a titanium oxide layer 21 is formed on the second silicide layer 92.

The first silicide layer 91 is formed of a compound containing titanium, a high melting point metal, and silicon. The second silicide layer 92 is formed of a compound (TiSi$_X$) containing titanium and silicon. Here, "X" in "TiSi$_X$" is 2, for example. The titanium oxide layer 21 is formed when oxygen or the like contained in the oxide film 20 reacts with titanium constituting the second metal layer 62. The titanium oxide layer 21 may have a composition formula represented by "TiO$_X$." "X" in "TiO$_X$" is 2, for example. Further, in the "(d) heating step," a mixed layer of the titanium oxide layer 21 and the second silicide layer 92 may be formed in a region where the titanium oxide layer 21 is formed in FIG. 2D.

<First Action Effect>

In the second embodiment, the high melting point metal causes the same effect as that of tantalum described above as the first action effect of the first embodiment. That is, according to the second embodiment, the contact resistance between the impurity-doped region 3 and the first silicide layer 91 may be reduced.

<Second Action Effect>

Further, in the second embodiment, the first silicide layer 91 containing the high melting point metal causes the same effect as that of the first silicide layer 91 described above as the second action effect of the second embodiment. That is, in the second embodiment as well, with the first silicide layer 91, an increase in contact resistance is prevented. Further, with the first silicide layer 91, a highly heat-resistant contact is obtained since it is resistant to aggregation due to heat.

<Third Action Effect>

In the "(d) heating step," oxygen contained in the oxide film 20 bonds with titanium contained in the second metal layer 62 to form the titanium oxide layer 21. As a result, the oxide film 20 that may interfere with a uniform silicidation reaction between the impurity-doped region 3 and the first metal layer 61 is removed. Therefore, non-uniformity of the silicidation reaction between the impurity-doped region 3 and the first metal layer 61 is reduced.

Comparative Example

Figures 3A, 3B, 3C:
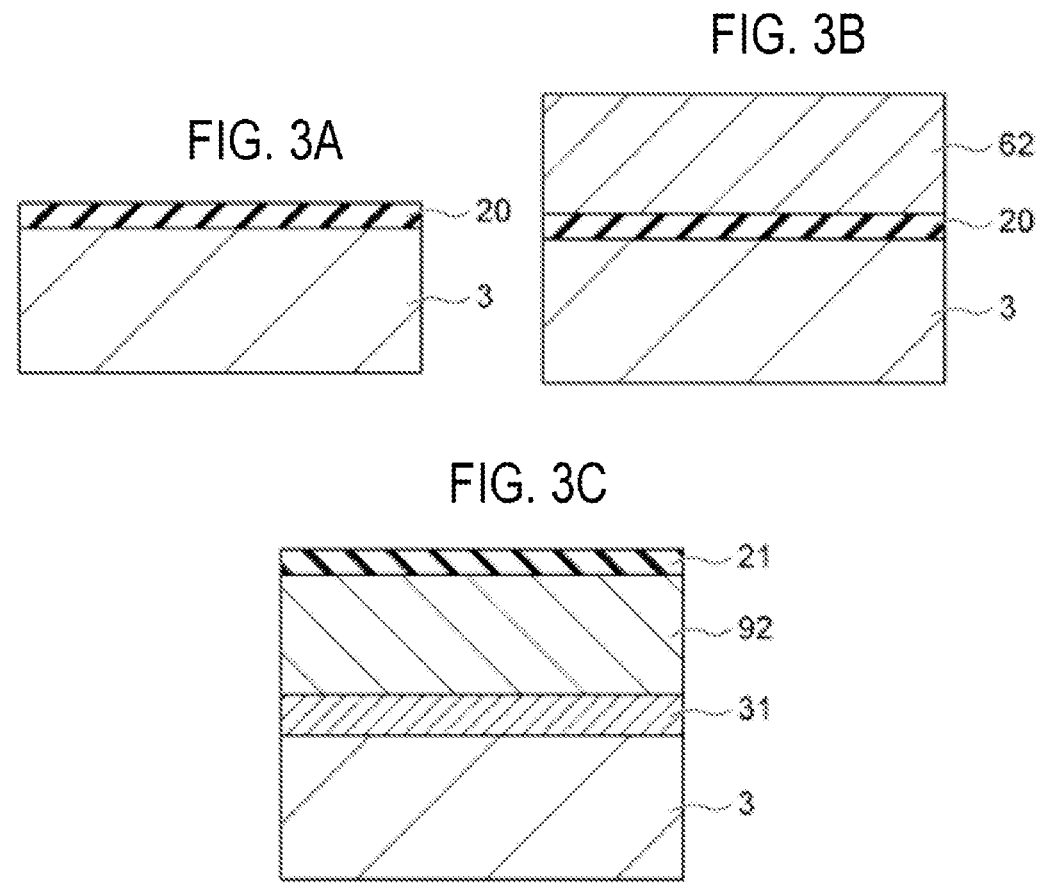

Here, a comparative example will be described. FIGS. 3A, 3B, and 3C are diagrams illustrating a method of manufacturing an electrode of a semiconductor device according to a comparative example. This method of manufacturing the electrode includes (a) substrate preparation step, (b) second metal layer formation step, and (c) heating step. The (a) substrate preparation step, (b) second metal layer formation step, and (c) heating step are performed in this order. Hereinafter, these steps will be described.

(a) Substrate Preparation Step

The "(a) substrate preparation step" of the comparative example is the same as the "(a) substrate preparation step" of the second embodiment, as illustrated in FIG. 3A.

(b) Second Metal Layer Formation Step

The manufacturing method of the comparative example does not include the first metal layer formation step in the second embodiment. In the manufacturing method of the comparative example, as illustrated in FIG. 3B, the second metal layer 62 is formed on the impurity-doped region 3 with the oxide film 20 interposed therebetween. In the second metal layer formation step, as illustrated in FIG. 3B, the second metal layer 62 is formed directly on the oxide film 20. A method of forming the second metal layer 62 is a sputtering method or the like. The second metal layer 62 is a titanium layer containing titanium.

(c) Heating Step

In the heating step of the comparative example (silicidation reaction annealing step), the semiconductor substrate including the oxide film 20 and the second metal layer 62 is heated (annealed). The "(c) heating step" of the comparative example is the same step as the "(d) heating step" of the second embodiment, and various conditions thereof are also the same as the corresponding conditions of the "(d) heating step" of the second embodiment. By this annealing, as illustrated in FIG. 3C, the second silicide layer 92 is formed on the impurity-doped region 3. By this annealing, the titanium oxide layer 21 (TiO$_X$) is formed on the second silicide layer 92. In addition, a titanium boride layer 31 (TiB$_2$) may be formed between the second silicide layer 92 and the impurity-doped region 3.

<Consideration>

Hereinafter, the first embodiment, the second embodiment, and the comparative example will be considered with reference to FIGS. 4A, 4B, 4C and 4D. FIGS. 4A, 4B, 4C, and 4D are graphs illustrating a relationship between a depth D (nm) from the surface of the substrate and an impurity concentration Ci (cm$^{-3}$) according to the comparative example.

Figures 4A, 4B, 4C, 4D:
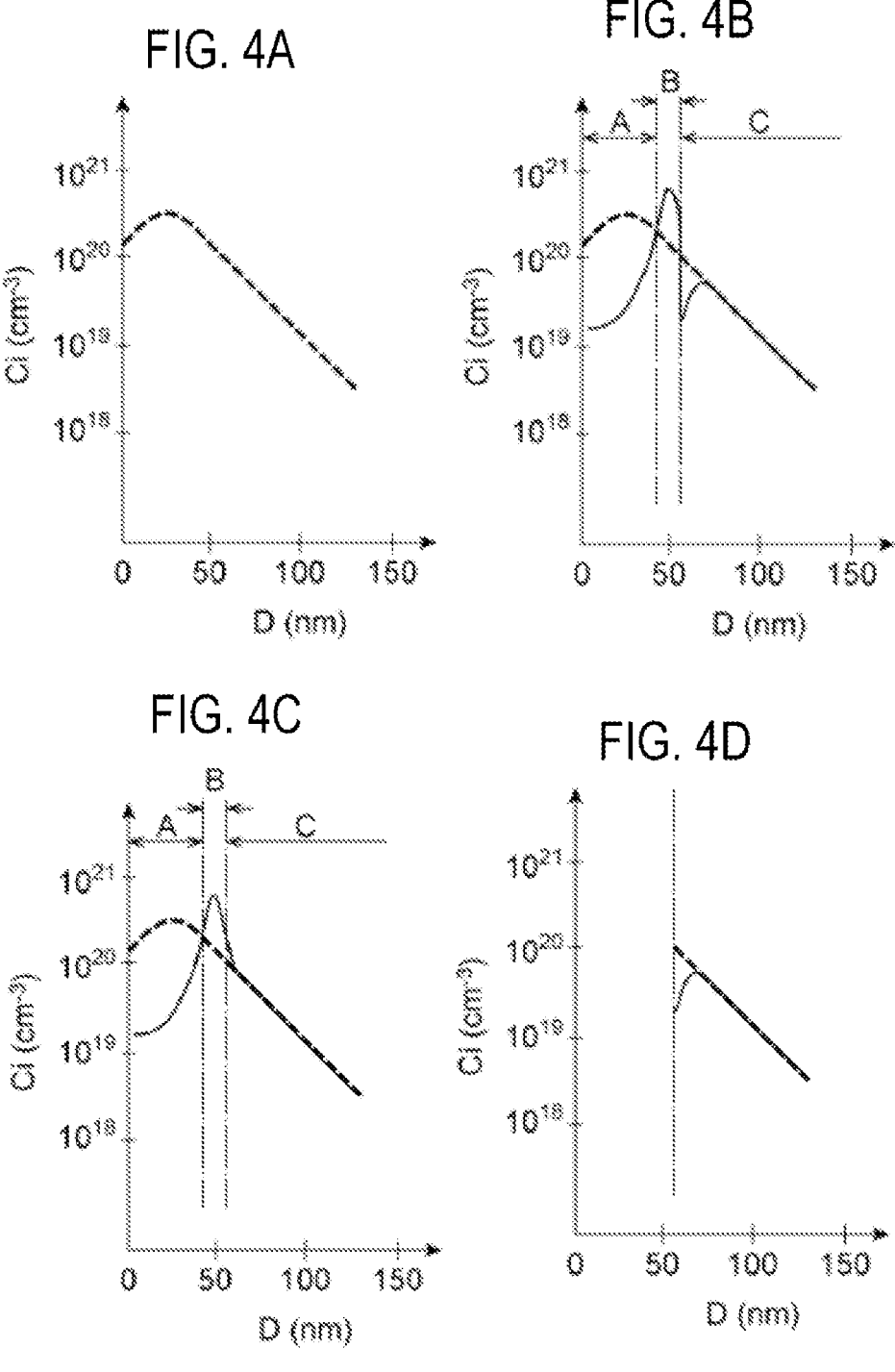
FIGS. 4A, 4B, 4C, and 4D are graphs illustrating a relationship between a depth D (nm) from a surface of a substrate and an impurity concentration $Ci$ ($cm^{-3}$) according to the comparative example.

FIG. 4A illustrates an impurity concentration distribution after completion of the "(a) substrate preparation step" (that is, an impurity concentration distribution in an initial state) of the comparative example described above. The impurity concentration distribution in the initial state is also indicated by dotted lines in FIGS. 4B to 4D. FIG. 4B illustrates an impurity concentration distribution (solid line) estimated after the end of the "(c) heating step" of the comparative example described above. In FIG. 4B, a first region A indicates a region of the second silicide layer 92 (TiSi$_2$). In FIG. 4B, a second region B indicates a region of the titanium boride layer 31 (TiB$_2$). In FIG. 4B, a third region C indicates the impurity-doped region 3 after silicide formation.

As illustrated in FIG. 4B, in the comparative example, a concentration of boron (impurity) contained in the titanium boride layer 31 (TiB$_2$) is high. Further, in the comparative example, as illustrated in FIG. 4B, the impurity concentration Ci (cm$^{-3}$) in the vicinity of the boundary between the second region B and the third region C is lower than the impurity concentration in the initial state.

Here, validity of the estimation of the impurity concentration distribution in the comparative example illustrated in FIG. 4B will be described. The impurity concentration is measured by using, for example, a secondary ion mass spectroscopy (SIMS) method. FIG. 4C illustrates the impurity concentration distribution (solid line) measured by the SIMS method on the substrate after the "(c) heating step" of the comparative example. When an analysis is performed by the SIMS method from a region with a high impurity concentration (high concentration region) in the vicinity of the surface of the substrate toward a region with a low impurity concentration (low concentration region) inside the substrate, impurity atoms contained in the high concentration region move to the low concentration region by knock-on. Accordingly, in the SIMS method, the impurity concentration in the low concentration region generated in the vicinity of the boundary between the titanium boride layer 31 (second region B) and the impurity-doped region 3 (third region C) may not be accurately measured. However, the impurity concentration in a portion from the surface of the substrate to the titanium boride layer 31 (second region B) measured by the SIMS method is approximately accurate.

FIG. 4D illustrates the impurity concentration distribution (solid line) measured by the SIMS method after removing the second silicide layer 92 (TiSi$_2$) and the titanium boride layer 31 (TiB$_2$) from the substrate after the "(c) heating step" of the comparative example. The TiSi$_2$ layer may be removed by using, for example, diluted hydrofluoric acid (HF). The TiB$_2$ layer may be removed by using, for example, diluted H$_2$O$_2$. Since the impurity concentration in FIG. 4D is measured by the SIMS method after removing the high concentration region, it accurately reflects the impurity concentration in the impurity-doped region 3 (third region C). Based on the overall measurement results of FIGS. 4C and 4D described above, it may be determined that the estimation of the impurity concentration distribution of FIG. 4B is appropriate.

As illustrated in FIG. 4B, in the comparative example, the concentration of boron (impurity) contained in the titanium boride layer 31 (TiB$_2$) is high. However, boron contained in the titanium boride layer 31 (TiB$_2$) does not contribute to an increase in electrical conductivity and a reduction in contact resistance.

Further, in the comparative example, as illustrated in FIG. 4B, the impurity concentration Ci (cm$^{-3}$) in the vicinity of the boundary between the second region B and the third region C is lower than the impurity concentration in the initial state. It is contemplated that this is because the impurity (boron) in the vicinity of the boundary between titanium boride layer 31 (second region B) and the impurity doped region 3 (third region C) is absorbed by the titanium boride layer 31 when the titanium boride layer 31 is formed. In addition, in the comparative example, the impurity concentration Ci (cm$^{-3}$) in the vicinity of this boundary is less than $1 \times 10^{20}$ cm$^{-3}$.

On the other hand, in the first embodiment and the second embodiment described above, the impurity concentration of the impurity-doped region 3 at the interface between the silicide layer 9 and the impurity-doped region 3 is relatively high and is $1 \times 10^{20}$ cm$^{-3}$ or more. Thus, according to the first embodiment and the second embodiment, contact resistance may be reduced.

[First Manufacturing Method of Semiconductor Device]

Hereinafter, a first manufacturing method of a semiconductor device with an electrode according to an exemplary embodiment of the present disclosure will be described with reference to FIGS. 5A, 5B, 5C, 5D, 5E, 5F and 5G. FIGS. 5A, 5B, 5C, 5D, 5E, 5F and 5G are diagrams illustrating the first manufacturing method of the semiconductor device with the electrode according to the exemplary embodiment. This manufacturing method (first manufacturing method) includes (a) impurity-doped region formation step, (b) insulating film formation step, (c) contact hole formation step, (d) metal layer formation step, (e) barrier metal formation step, (f) heating step, and (g) polishing step. The (a) impurity-doped region formation step, (b) insulating film formation step, (c) contact hole formation step, (d) metal layer formation step, (e) barrier metal formation step, (f) heating step, and (g) polishing step are performed in this order. Hereinafter, these steps will be described.

(a) Impurity Doped Region Formation Step

Figures 5A, 5B, 5C, 5D, 5E, 5F, 5G:
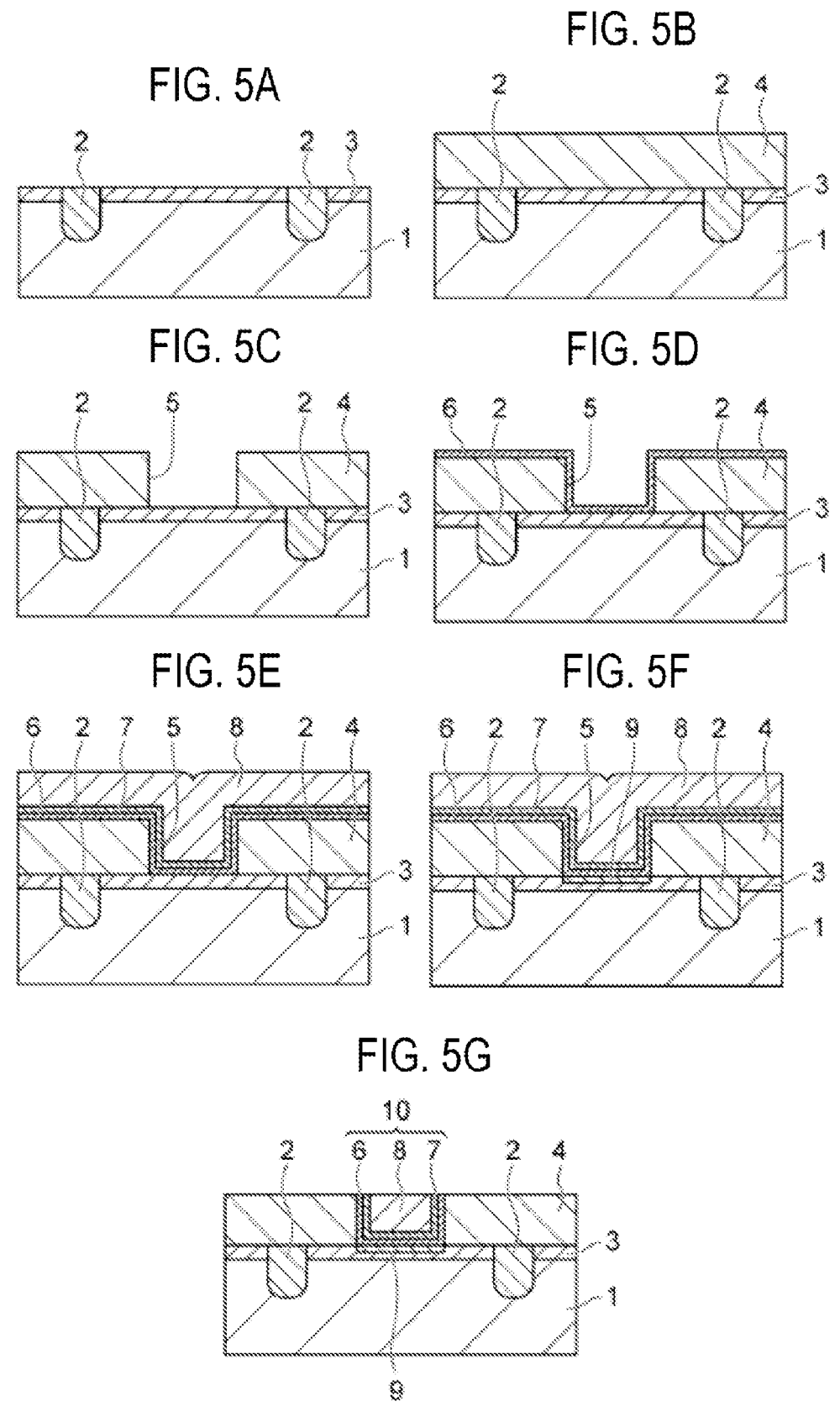

In the impurity doped region formation step, as illustrated in FIG. 5A, an element isolation 2 is formed on the side of a surface of a semiconductor substrate 1. The semiconductor substrate 1 is formed of silicon. The element isolation 2 is formed of silicon dioxide or the like. Subsequently, an impurity is added into a region on the side of the surface of the semiconductor substrate 1 by using an ion implantation method to form the impurity-doped region 3. The impurity doped region 3 has a conductivity type opposite to that of the semiconductor substrate 1. This method of forming the impurity-doped region 3 is the same as the method of forming the impurity-doped region 3 in "(a) substrate preparation step" of the first embodiment or the second embodiment described above.

(b) Insulating Film Formation Step

In the insulating film formation step, as illustrated in FIG. 5B, an insulating film 4 (pre-metal dielectrics (PMD)) is formed on the impurity-doped region 3. The insulating film 4 is formed of silicon dioxide or the like. The insulating film 4 may be formed by using a chemical vapor deposition (CVD) method.

(c) Contact Hole Formation Step

In the contact hole formation step, as illustrated in FIG. 5C, a contact hole 5 is formed. The contact hole 5 is formed to penetrate the insulating film 4. The contact hole 5 may be formed by photolithography, reactive ion etching (RIE), and the like.

(d) Metal Layer Formation Step

In the metal layer formation step, as illustrated in FIG. 5D, a metal layer 6 is deposited on a surface of the insulating film 4, an inner surface of the contact hole 5, and an exposed surface of the impurity-doped region 3. Further, before the metal layer 6 is deposited, a native oxide film with a thickness of several nanometers may be formed on the exposed surface of the impurity-doped region 3. The native oxide film is formed of silicon dioxide, which is the same material as the insulating film 4. This native oxide film may be etched by using dilute hydrofluoric acid or the like before the metal layer 6 is deposited. A concentration of dilute hydrofluoric acid is set sufficiently low to prevent the insulating film 4 from becoming too thin. Alternatively, an etching time of using dilute hydrofluoric acid is set short to prevent the insulating film 4 from becoming too thin. This metal layer formation step is the same as the "(b) first metal layer formation step" and the "(c) second metal layer formation step" of the first embodiment or the second embodiment described above.

(e) Barrier Metal Formation Step

In the barrier metal formation step, as illustrated in FIG. 5E, a barrier metal layer 7 is deposited on the metal layer 6. A metal layer 8 is deposited on the barrier metal layer 7. The barrier metal layer 7 is formed of titanium nitride (TiN) or the like. The metal layer 8 is formed of a low resistance metal such as tungsten. A method of depositing the barrier metal layer 7 and the metal layer 8 is a CVD method, an atomic layer deposition (ALD) method, a physical vapor deposition (PVD) method, or the like. The metal layer 8 may be formed to completely fill the contact hole 5 with the metal layer 8. The barrier metal layer 7 prevents a reaction between the metal layer 8 and the metal layer 6 and a reaction between the metal layer 8 and the semiconductor substrate 1. When the metal layer 8 will be deposited by using a CVD method or an ALD method, the barrier metal layer 7 prevents an impurity contained in the metal layer 8 from diffusing into the metal layer 6 or the semiconductor substrate 1.

(f) Heating Step

In the heating step (silicidation reaction annealing step), the semiconductor substrate 1 (see FIG. 5E) on which the above-described respective layers are formed is heated (annealed). This annealing causes a reaction between the metal layer 6 and the impurity-doped region 3. As a result of this reaction, as illustrated in FIG. 5F, a silicide layer 9 is formed on the side of the surface of the substrate. This heating step may be performed under a nitrogen ($N_2$) atmosphere. This heating step may be a separate step, or may also serve as a step of heating the barrier metal layer 7, the metal layer 8, and the like. Further, this heating step is the same as the "(d) heating step" in the first embodiment or the second embodiment described above.

(g) Polishing Step

In the polishing step, the metal layer 6, the barrier metal layer 7, and the metal layer 8 provided outside the contact hole 5 are removed by using a chemical mechanical polishing (CMP) method or the like. The CMP is performed until the insulating film 4 is exposed, as illustrated in FIG. 5G. Thus, a contact plug 10 (electrode) is formed. The contact plug 10 is processed into a shape of plug and includes the silicide layer 9, the metal layer 6, the barrier metal layer 7, and the metal layer 8. Further, the impurity-doped region 3 and the contact plug 10 are electrically connected to each other.

In the first manufacturing method of the semiconductor device, the silicide layer 9 is formed in the same manner as the formation of the silicide layer 9 in the manufacturing method of the first embodiment or the second embodiment described above. Accordingly, with the first manufacturing method of the semiconductor device, an increase in the resistance of the impurity-doped region 3 is prevented. Therefore, according to the first manufacturing method of the semiconductor device, the contact resistance between the impurity-doped region 3 and the silicide layer 9 may be reduced.

[Second Manufacturing Method of Semiconductor Device]

Hereinafter, a second manufacturing method of a semiconductor device with an electrode according to an exemplary embodiment of the present disclosure will be described with reference to FIGS. 6A, 6B, 6C, and 6D. FIGS. 6A, 6B, 6C, and 6D are diagrams illustrating the second manufacturing method of the semiconductor device with the electrode according to the exemplary embodiment. This example is an embodiment to which a self-aligned silicide (SALICIDE) method is applied. This manufacturing method (second manufacturing method) includes (a) impurity-doped region formation step, (b) metal layer formation step, (c) heating step, and (d) unreacted metal removing step. The (a) impurity-doped region formation step, (b) metal layer formation step, (c) heating step, and (d) unreacted metal removing step are performed in this order. Hereinafter, these steps will be described.

(a) Impurity-Doped Region Formation Step

Figure 6A:
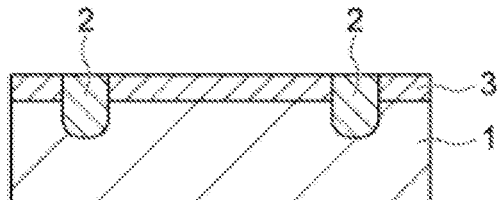
FIGS. 6A, 6B, 6C, and 6D are diagrams illustrating a second manufacturing method of a semiconductor device including an electrode according to an exemplary embodiment of the present disclosure.

In the impurity-doped region formation step, as illustrated in FIG. 6A, the element isolation 2 is formed on the side of the surface of the semiconductor substrate 1. The semiconductor substrate 1 is formed of silicon. The element isolation 2 is formed of silicon dioxide or the like. Subsequently, an impurity is added into a region on the side of the surface of the semiconductor substrate 1 to form the impurity-doped region 3. A method of forming the impurity-doped region 3 is the same as the method of forming the impurity-doped region 3 in "(a) substrate preparation step" of the first embodiment or the second embodiment described above.

(b) Metal Layer Formation Step

Figure 6B:
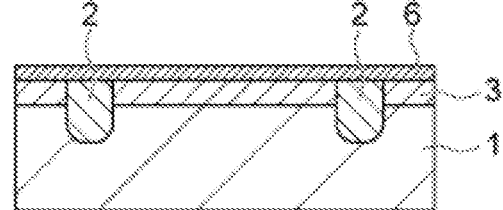

In the metal layer formation step, as illustrated in FIG. 6B, the metal layer 6 is formed on the impurity-doped region 3. This metal layer formation step is the same as the "(b) first metal layer formation step" and the "(c) second metal layer formation step" of the first embodiment or the second embodiment described above.

(c) Heating Step

Figure 6C:
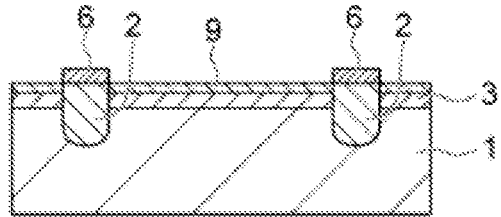

In the heating step (silicidation reaction annealing process), the semiconductor substrate 1 on which the metal layer 6 is formed is heated (annealed). This annealing causes a reaction between the metal layer 6 and the impurity-doped region 3. By this reaction, as illustrated in FIG. 6C, the silicide layer 9 is formed on side of the surface of the semiconductor substrate 1. The metal layer 6 remains unreacted on the element isolation 2. This heating step is the same as the "(d) heating step" of the first embodiment or the second embodiment described above.

(d) Unreacted Metal Removal Step

Figure 6D:
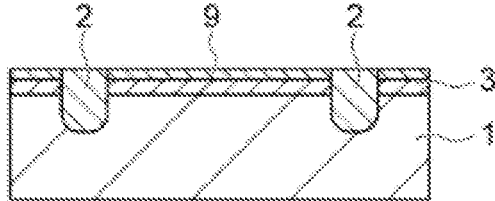

In the unreacted metal removal step, as illustrated in FIG. 6D, the unreacted metal layer 6 is selectively removed by cleaning with liquid chemical. The silicide layer 9 obtained by the second manufacturing method is electrically connected to the impurity-doped region 3, and thus, functions as an electrode.

In the second manufacturing method, the silicide layer 9 is formed by the manufacturing method of the first embodiment or the second embodiment described above. Accordingly, with the second manufacturing method, an increase in the resistance of the impurity-doped region 3 is prevented. Therefore, with the second manufacturing method, the contact resistance between the impurity-doped region 3 and the silicide layer 9 may be reduced.

[Third Manufacturing Method of Semiconductor Device]

Figures 7A, 7B:
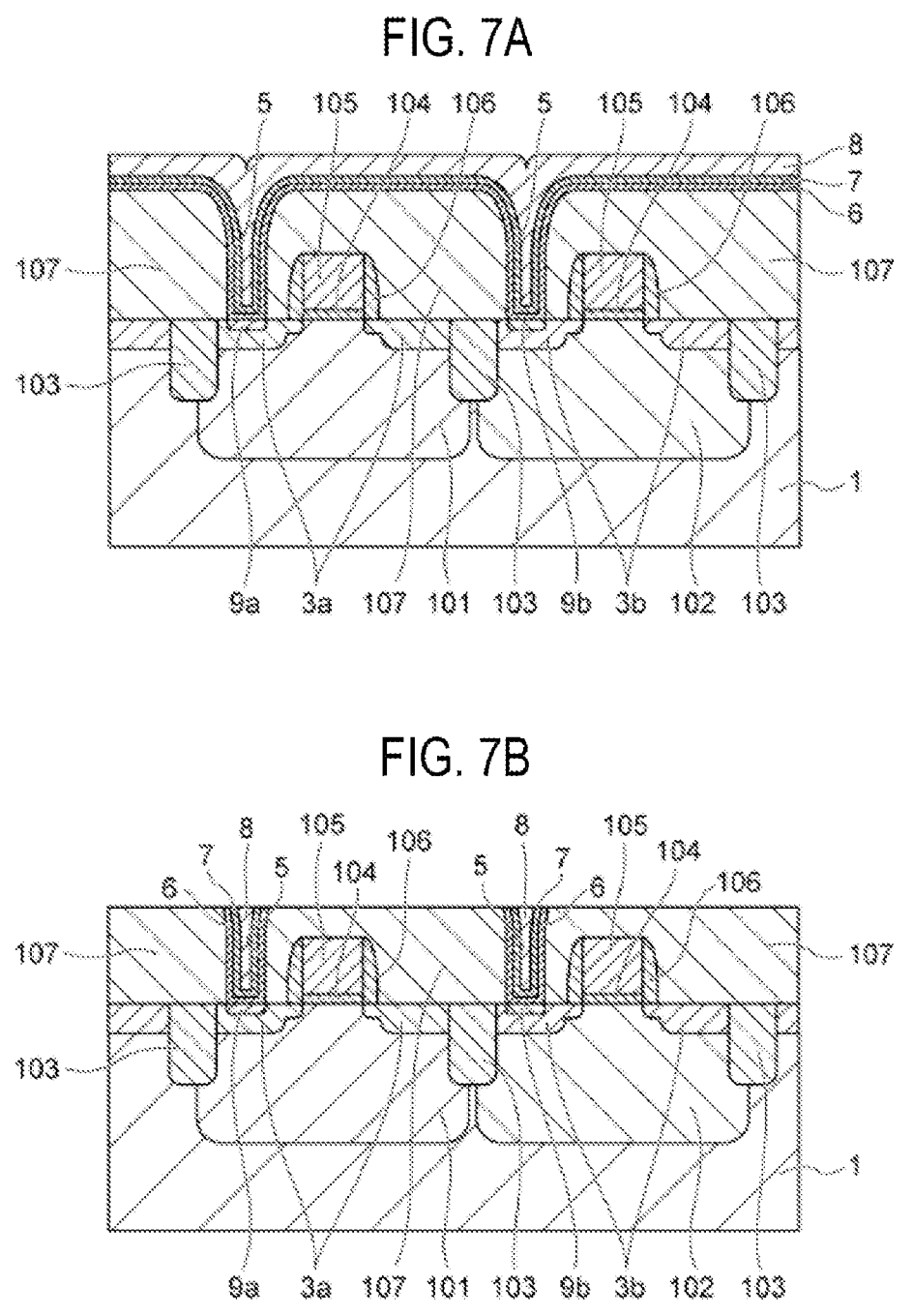

Hereinafter, a third manufacturing method of a semiconductor device will be described with reference to FIGS. 7A and 7B. FIGS. 7A and 7B are diagrams illustrating the third manufacturing method of the semiconductor device with an electrode according to an exemplary embodiment of the present disclosure. This manufacturing method (third manufacturing method) includes (a) element formation step and (b) polishing step. The (a) element formation step and (b) polishing process are performed in this order. Hereinafter, these steps will be described.

(a) Element Formation Step

In the element formation step, an element structure illustrated in FIG. 7A is formed. That is, in the element formation step, an element isolation 103, a p well 101, an $n^-$ well 102, an $n^+$ first impurity-doped region 3a, and a $p^+$ second impurity-doped region 3b are formed in the semiconductor substrate 1. Subsequently, a gate insulating film 104, a gate electrode 105, and a gate sidewall 106 are formed on the semiconductor substrate 1. Methods of forming these may be commonly known. In the element structure illustrated in FIG. 7A, a pair of first impurity-doped regions 3a (n-type) in the $p^-$ well 101 form a source region and a drain region of a field effect transistor, respectively. A pair of second impurity-doped regions 3b (p-type) in the $n^-$ well 102 form a source region and a drain region of a field effect transistor, respectively.

An impurity in the n-type first impurity-doped region 3a is a general n-type impurity such as As. The first impurity-doped region 3a may be formed by using an n-type impurity in the "(a) substrate preparation step" of the first embodiment or the second embodiment described above. An impurity in the p-type second impurity-doped region 3*b* is boron
or the like. The second impurity-doped region 3*b* is formed
by using the "(a) substrate preparation step" of the first
embodiment or the second embodiment described above.

Subsequently, an insulating film 107 is deposited on the
semiconductor substrate 1. Further, an upper surface of the
insulating film 107 is planarized by CMP or the like. Then,
the contact hole 5 is formed in the insulating film 107 by
using photolithography, RIE, and the like. The contact hole
5 is formed to penetrate the insulating film 107. Thereafter,
the metal layer 6 is formed on the exposed surfaces of the
first impurity-doped region 3*a* and the second impurity-
doped region 3*b*. The step of forming the metal layer 6 is the
same as the "(b) first metal layer formation step" and the "(c)
second metal layer formation step" of the first embodiment
or the second embodiment described above.

Subsequently, the barrier metal layer 7 is deposited on the
metal layer 6. The metal layer 8 is deposited on the barrier
metal layer 7. The metal layer 8 is formed of a low-
resistance metal such as tungsten.

Then, a heating process (silicidation reaction annealing
process) is performed. The heating step is the same as the
"(d) heating step" of the first embodiment or the second
embodiment described above. In this heating step, the semi-
conductor substrate 1 on which the above-described element
structure is formed is heated (annealed). This annealing
causes a reaction between the metal layer 6 and the first
impurity-doped region 3*a*, thus forming a silicide layer 9*a* at
the bottom of the contact hole 5. The silicide layer 9*a*
includes two silicide layers illustrated in the first embodi-
ment or the second embodiment. Further, this annealing
causes a reaction between the metal layer 6 and the second
impurity-doped region 3*b*, thus forming a silicide layer 9*b* at
the bottom of the contact hole 5. The silicide layer 9*b*
includes two silicide layers (first silicide layer 91 and second
silicide layer 92) illustrated in the first embodiment or the
second embodiment. The silicide layer 9*a* is in contact with
the first impurity-doped region 3*a*, and the silicide layer 9*b*
is in contact with the second impurity-doped region 3*b*.

(b) Polishing Step

In the polishing step, the metal layer 6, the barrier metal
layer 7, and the metal layer 8 provided outside the contact
hole 5 are removed by using a CMP method or the like. The
CMP is performed until the insulating film 107 is exposed,
as illustrated in FIG. 7B. Thus, a contact plug (electrode)
including the silicide layer 9*a*, the metal layer 6, the barrier
metal layer 7, and the metal layer 8 is formed on the side of
the first impurity-doped region 3*a*. Further, a contact plug
(electrode) including the silicide layer 9*b*, the metal layer 6,
the barrier metal layer 7, and the metal layer 8 is formed on
the side of the second impurity-doped region 3*b*.

Since the silicide layer 9*a* and the silicide layer 9*b* are
formed by the manufacturing method of the first embodi-
ment or the second embodiment described above, the
increase in the resistance of the first impurity-doped region
3*a* and the second impurity-doped region 3*b* is prevented.
Accordingly, the contact resistance between the first impu-
rity-doped region 3*a* and the silicide layer 9*a* may be
reduced. Further, the contact resistance between the second
impurity-doped region 3*b* and the silicide layer 9*b* may be
reduced.

While various exemplary embodiments have been
described above, various additions, omissions, substitutions,
and modifications may be made, without being limited to the
exemplary embodiments described above. Further, elements
from different embodiments may be combined to form other
embodiments. Further, it will be understood from the above description that various embodiments of the present disclo-
sure have been set forth herein for purpose of illustration,
and that various changes may be made without departing
from the scope and spirit of the present disclosure. Accord-
ingly, the various embodiments disclosed herein are not
intended to be limiting, and true scope and spirit are indi-
cated by the appended claims.

EXPLANATION OF REFERENCE NUMERALS

1: semiconductor substrate, 2: element isolation, 3: impu-
rity-doped region, 3*a*: first impurity-doped region, 3*b*:
second impurity-doped region, 4: insulating film, 5:
contact hole, 6: metal layer, 7: barrier metal layer, 8:
metal layer, 9: silicide layer, 9*a*: silicide layer, 9*b*:
silicide layer, 10: contact plug, 20: oxide film, 21:
titanium oxide layer, 31: titanium boride layer, 61: first
metal layer, 62: second metal layer, 91: first silicide
layer, 92: second silicide layer

What is claimed is:

1. A method of manufacturing an electrode of a semicon-
ductor device, the method comprising:
  preparing a semiconductor substrate including an impu-
    rity-doped region;
  forming a first metal layer on the impurity-doped region;
  forming a second metal layer on the first metal layer; and
  heating the semiconductor substrate including the first
    metal layer and the second metal layer,
  wherein the impurity-doped region contains silicon,
  wherein the first metal layer contains tantalum,
  wherein the second metal layer contains titanium,
  wherein, by the heating, a silicidation reaction is caused
    among the impurity-doped region, the first metal layer,
    and the second metal layer, such that a first silicide
    layer containing titanium, tantalum, and silicon is
    formed on the impurity-doped region, and a second
    silicide layer containing titanium and silicon is formed
    on the first silicide layer, and
  wherein an impurity concentration of the impurity-doped
    region in the preparing the semiconductor substrate is
    set such that an impurity concentration at an interface
    between the first silicide layer and the impurity-doped
    region after the silicidation reaction is $1\times10^{20}$ cm$^{-3}$ or
    more.

2. The method of claim 1, wherein an impurity in the
impurity-doped region is boron.

3. A method of manufacturing an electrode of a semicon-
ductor device, the method comprising:
  preparing a semiconductor substrate including an impu-
    rity-doped region and an oxide film formed on the
    impurity-doped region;
  forming a first metal layer on the impurity-doped region
    with the oxide film interposed therebetween;
  forming a second metal layer on the first metal layer; and
  heating the semiconductor substrate including the first
    metal layer and the second metal layer,
  wherein the impurity-doped region contains silicon,
  wherein the oxide film contains silicon dioxide,
  wherein the first metal layer contains a high melting point
    metal including at least one selected from the group of
    tantalum, tungsten, and molybdenum,
  wherein the second metal layer contains titanium,
  wherein, by the heating, a silicidation reaction is caused
    among the impurity-doped region, the first metal layer,
    and the second metal layer, such that a first silicide
    layer containing titanium, the high melting point metal,
    and silicon is formed on the semiconductor substrate, and a second silicide layer containing titanium and silicon is formed on the first silicide layer, and wherein, by the heating, oxygen contained in the oxide film reacts with titanium contained in the second metal layer, such that a titanium oxide layer is formed on the second silicide layer.

4. The method of claim 3, wherein an impurity in the impurity-doped region is boron.

5

\* \* \* \* \*